United States Patent
Bourgeat et al.

(10) Patent No.: US 9,899,366 B2
(45) Date of Patent: Feb. 20, 2018

(54) ELECTRONIC DEVICE, IN PARTICULAR FOR PROTECTION AGAINST OVERVOLTAGES

(71) Applicant: STMicroelectronics SA, Montrouge (FR)

(72) Inventors: Johan Bourgeat, Saint Pierre d'Allevard (FR); Jean Jimenez, Saint Theoffrey (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/096,975

(22) Filed: Apr. 12, 2016

(65) Prior Publication Data

US 2017/0148780 A1  May 25, 2017

(30) Foreign Application Priority Data

Nov. 19, 2015  (FR) ..................... 15 61135

(51) Int. Cl.
| | |
|---|---|
| *H01L 29/66* | (2006.01) |
| *H01L 27/02* | (2006.01) |
| *H01L 29/74* | (2006.01) |
| *H01L 29/744* | (2006.01) |
| *H01L 29/10* | (2006.01) |

(52) U.S. Cl.
CPC ...... *H01L 27/0251* (2013.01); *H01L 29/1095* (2013.01); *H01L 29/744* (2013.01); *H01L 29/7436* (2013.01)

(58) Field of Classification Search
USPC .......................................... 257/132
See application file for complete search history.

(56) References Cited

U.S. PATENT DOCUMENTS

| | | | | |
|---|---|---|---|---|
| 5,883,401 | A * | 3/1999 | Pezzani ............... | H03K 17/725 257/121 |
| 6,323,718 | B1 * | 11/2001 | Rault ................... | H01L 27/0641 257/E27.018 |
| 6,583,496 | B2 * | 6/2003 | Galtie ................ | H01L 27/0817 257/107 |
| 6,594,132 | B1 | 7/2003 | Avery | |
| 9,019,666 | B2 | 4/2015 | Bourgeat et al. | |
| 2003/0076636 | A1 | 4/2003 | Ker et al. | |
| 2009/0237847 | A1 | 9/2009 | Ryu et al. | |

FOREIGN PATENT DOCUMENTS

| | | |
|---|---|---|
| EP | 2246885 A1 | 11/2010 |
| FR | EP 2246885 A1 * 11/2010 | ......... H01L 27/0262 |

OTHER PUBLICATIONS

INPI Search Report and Written Opinion for FR 1561135 dated Jul. 28, 2016 (7 pages).

\* cited by examiner

*Primary Examiner* — Telly Green
(74) *Attorney, Agent, or Firm* — Gardere Wynne Sewell LLP

(57) ABSTRACT

An electronic device is formed by a sequence of at least two thyristors coupled in series in a same conduction direction. Each thyristor has a gate of a first conductivity type. The gates of the first conductivity type for the thyristors in the sequence are coupled together in order to form a single control gate.

18 Claims, 3 Drawing Sheets

ELECTRONIC DEVICE, IN PARTICULAR FOR PROTECTION AGAINST OVERVOLTAGES

PRIORITY CLAIM

This application claims priority from French Application for Patent No. 1561135 filed Nov. 19, 2015, the disclosure of which is incorporated by reference.

TECHNICAL FIELD

Embodiments of the invention relate to electronic devices, such as electronic devices based on thyristors, also referred to by a person skilled in the art by the acronym "SCR" ("Silicon Controlled Rectifier"), and especially those designed to protect components against overvoltages, in particular overvoltages such as parasitic overvoltages produced during operation of the component, but also overvoltages occurring during electrostatic discharges ("Electro-Static Discharge": ESD).

BACKGROUND

Conventionally, a thyristor is made to conduct when the voltage across its terminals becomes greater than a trigger voltage.

Further to the trigger voltage, another important parameter of a thyristor is the holding voltage, that is to say the minimum voltage such that the thyristor remains conductive after having been triggered.

In certain applications, thyristors have a high trigger voltage, for example around 3.6 V, but a low holding voltage, for example around 1.2 V, which may then be less than the rated supply voltage of the integrated circuit incorporating such thyristors. This is the case, for example, with an integrated circuit having a supply voltage of 3.3 V.

Consequently, during operation of the integrated circuit, the thyristors may be triggered and become conductive during an electrical overstress ("Electrical OverStress": EOS) and then continue to conduct until they are destroyed, because the supply voltage of the circuit is then always greater than the holding voltage of these thyristors.

One solution, based on a protective device having a structure of three cascoded thyristors, is generally proposed in order to increase the holding voltage of such a protective device.

However, such a structure with three thyristors also increases the trigger voltage and the surface occupancy of the device on silicon.

SUMMARY

Thus, according to one embodiment, it is proposed to improve the performance of protective electronic devices based on thyristors by increasing the holding voltage without significantly increasing the trigger voltage.

According to another embodiment, it is proposed to produce such a device without having a significant effect on the surface occupancy on silicon.

One aspect proposes an electronic device comprising a sequence of at least two thyristors coupled in series in the same conduction direction (the anode and the cathode of two adjacent thyristors of the sequence are connected), each thyristor having a gate of a first conductivity type, all the gates of the first conductivity type of the thyristors being coupled in order to form a single gate.

Thus, the thyristors of the sequence are so to speak "merged" by connecting their gates of the same conductivity type in order to form a device having a single gate, for example of the first conductivity type, which will be connectable to a single trigger circuit. The holding voltage of the device is thus increased without significantly increasing, or even without modifying, the trigger voltage in comparison with that of a single thyristor, this trigger voltage being moreover much less than that of the cascoded structure of the prior art.

By way of indication but without limitation, the gates are advantageously of N-type conductivity, although they could be of P-type conductivity.

According to one embodiment, all the thyristors of the electronic device are arranged in the same semiconductor body having the first conductivity type.

Each thyristor has, within the semiconductor body, a first semiconductor region having a second conductivity type opposite to the first conductivity type and a second semiconductor region having the second conductivity type and including a semiconductor zone having the first conductivity type.

The first semiconductor region of a thyristor of the sequence is coupled by a metallization lying above the semiconductor body to the semiconductor zone of the preceding thyristor in the sequence. The semiconductor body forms the single gate.

Such an embodiment makes it possible to limit the surface occupancy on silicon.

Furthermore, the semiconductor body has, for example, a zone doped more heavily than the rest of the body. This may surround all the semiconductor regions and form a contact for the single gate.

The electronic device furthermore advantageously has a trigger circuit coupled to the single gate.

According to a preferred embodiment, the sequence of thyristors comprises a first thyristor and a second thyristor. The anode of the second thyristor is coupled to the cathode of the first thyristor.

According to this preferred embodiment, the trigger circuit is coupled to the single gate and to the cathode of the second thyristor.

Such a structure with two thyristors coupled in series may advantageously reduce by up to 40% the surface occupancy compared with the solution with three cascoded thyristors, while offering a higher holding voltage and a threshold voltage substantially equal to that of an electronic device having a single thyristor.

The electronic device may be used to protect a component arranged between the two ends of the sequence of thyristors. The trigger circuit may, for example, be coupled to the single gate and to one of the ends of the sequence.

BRIEF DESCRIPTION OF THE DRAWINGS

Other advantages and characteristics of the invention will become apparent on studying the detailed description of embodiments which are taken by way of non-limiting examples and illustrated by the appended drawings, in which.

DETAILED DESCRIPTION

Figure 1:
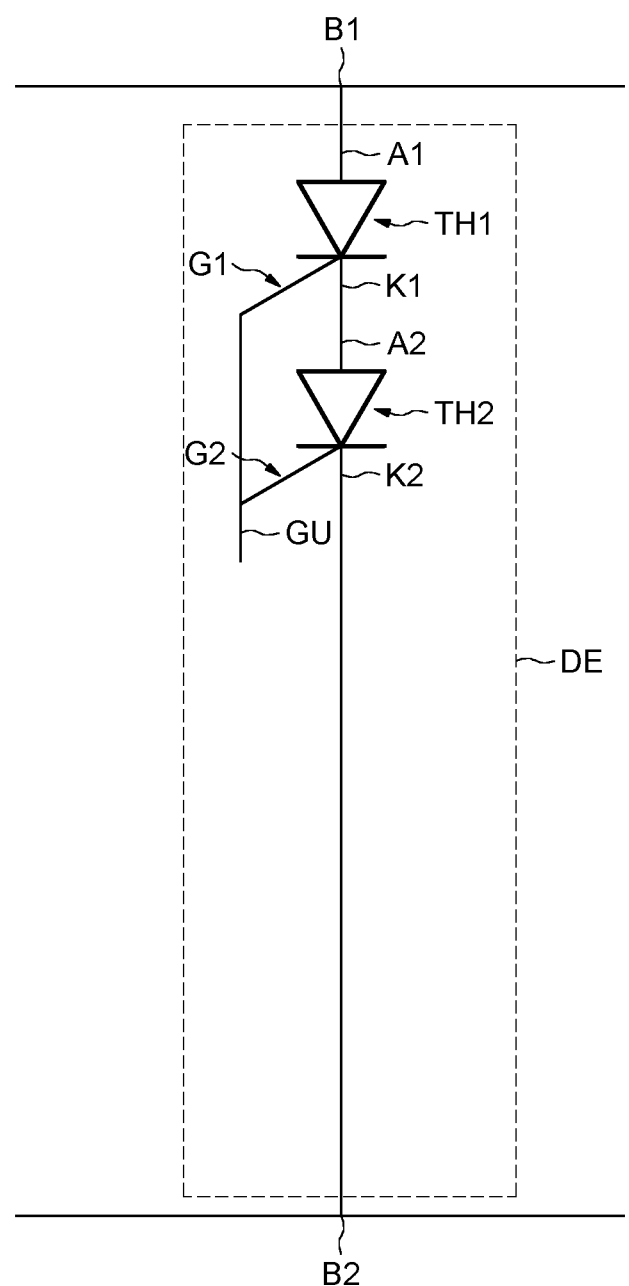
FIGS. 1 to 4 relate to various embodiments of an electronic device.

FIG. 1 schematically illustrates an example of an electronic device DE.

The device DE illustrated in FIG. 1 comprises a first thyristor TH1 and a second thyristor TH2, which are connected in series in the same conduction direction between a first terminal B1 and a second terminal B2. In this context, the phrase "in the same conduction direction" is intended to mean a connection between the anode and the cathode of two adjacent thyristors of the sequence.

The thyristor TH1 has an anode A1 coupled to the first terminal B1, a cathode K1 and a gate G1, for example the N-type gate. The thyristor TH2 has an anode A2 coupled to the cathode K1, a cathode K2 coupled to the second terminal B2, and its N-type gate G2 coupled to the gate G1 so as to form a single N-type gate GU.

Figure 2:
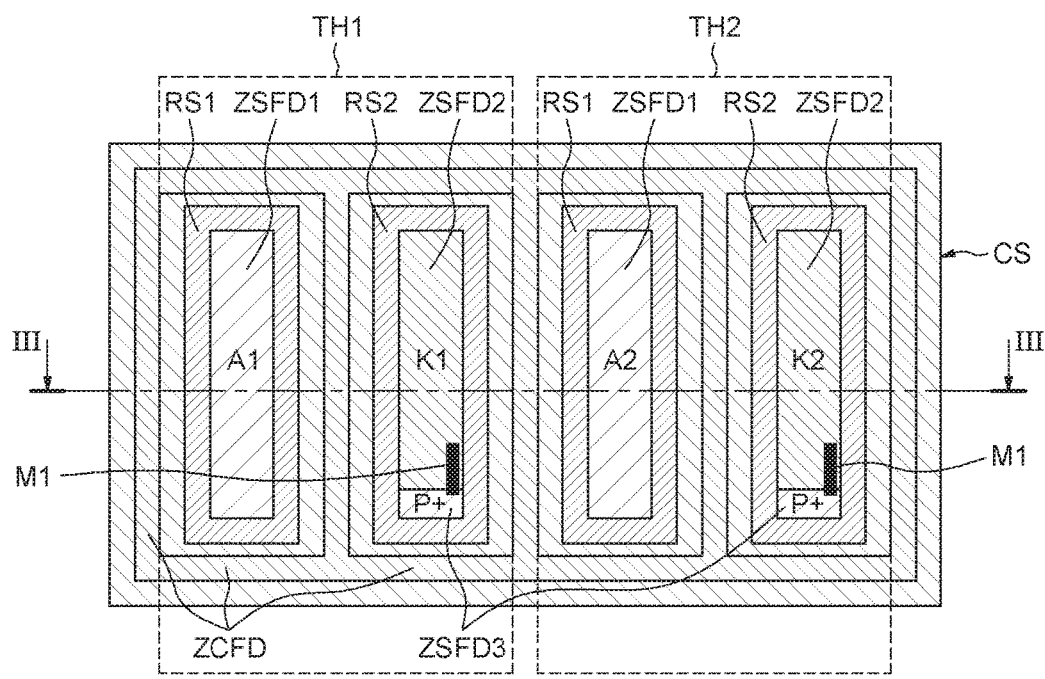
Figure 3:
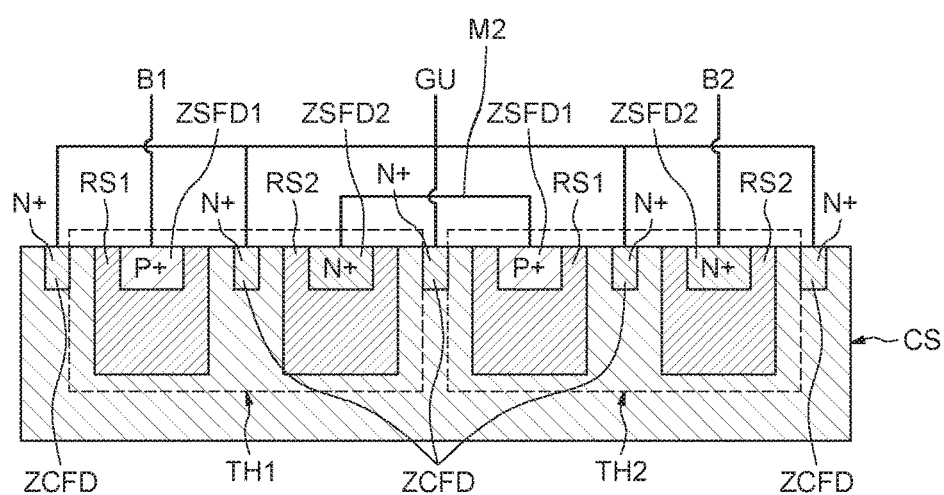

Reference will now be made to FIG. 2, which shows a diagram of the implementation of the electronic device DE described above and illustrated in FIG. 1 on silicon, and to FIG. 3, which is a view in section along the line of FIG. 2.

The thyristors TH1 and TH2 are formed in the same semiconductor body CS, for example of the N type.

Each thyristor TH1 or TH2 has, in the body CS, a first semiconductor region RS1 of P-type conductivity having a first semiconductor zone ZSFD1 doped more heavily (of the P+type). This first region RS1 forms the anode A1 or A2 of the thyristor TH1 or TH2, and the first semiconductor zone ZSFD1 forms a contacting region of the anode A1 or A2. The anode A1 of the first thyristor TH1 is connected to the first terminal B1 of the electronic device DE.

Each thyristor TH1 or TH2 furthermore has, in the body, a second semiconductor region RS2 of the P type containing a second semiconductor zone ZSFD2 of the opposite conductivity type and doped more heavily (N+ type). The second semiconductor zones ZSFD2 respectively form the cathodes K1 and K2 of the thyristors TH1 and TH2.

The second semiconductor region RS2 of each thyristor forms the P-type gate of this thyristor and furthermore has a third semiconductor zone ZSFD3 of the same conductivity type and doped more heavily (P+ type). The P-type gate is in this case short-circuited with the cathode zone ZSFD2 by a metallization M1 between the zones ZSFD2 and ZSFD3, because it is not used as a trigger gate.

The anode A2 of the second thyristor TH2 is connected to the cathode K1 of the first thyristor TH1 by a metallization M2 lying above the body CS, and the cathode of the second thyristor is connected to the second terminal B2.

The entire semiconductor body CS forms de facto the single N-type gate GU of the electronic device DE.

In this regard, the semiconductor body CS advantageously has a contact zone ZCFD doped more heavily than the rest of the body CS. This contact zone ZCFD surrounds all the semiconductor regions RS1 and RS2 and forms a contacting zone of the single N-type gate GU.

Such an integrated electronic device DE having two thyristors TH1 and TH2 advantageously makes it possible to reduce by up to 40% the surface occupancy compared with the solution of a protective device having a structure with three cascoded thyristors.

As regards the trigger voltage and the holding voltage of such a device, they are respectively of the order of 3.6 volts and 4 volts for implementation in a 28 nm CMOS technology.

Such a device is therefore highly suitable for protecting a component of an integrated circuit supplied with a supply voltage of 3.3 volts against overvoltages occurring during operation of the component.

Reference will now be made in this regard more particularly to FIG. 4 in order to illustrate an example of the application of the electronic device DE for the protection of a component 1 coupled between the first terminal B1 and the second terminal B2. For example, the component 1 may be a microcontroller or a processor core.

The first terminal B1 may, for example, be an input/output terminal ("I/O pad") of the integrated circuit containing the component, and the terminal B2 may be intended to be grounded.

Figure 4:
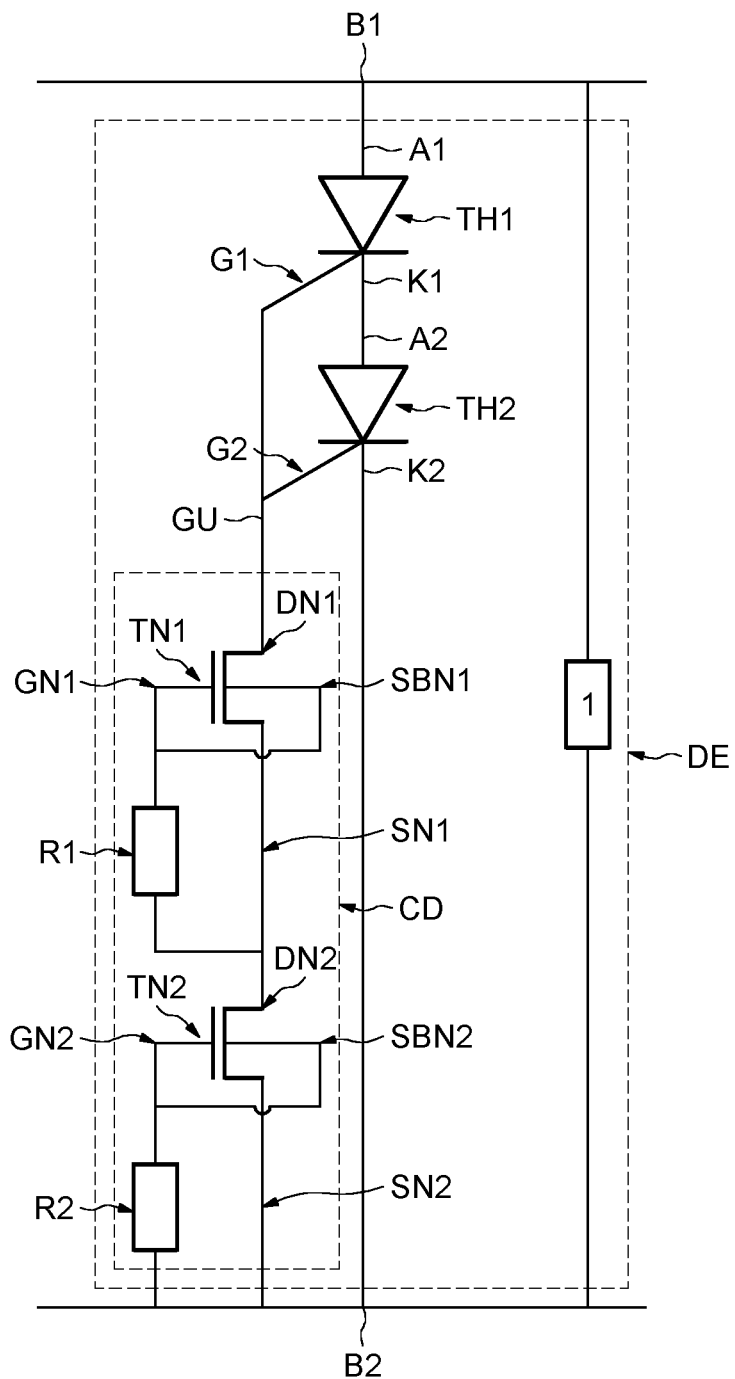

As illustrated in FIG. 4, the device DE has a trigger circuit connected in this case between the single gate GU and the terminal B2.

The trigger circuit CD may be based on MOS transistors with hybrid operation, as described in the international patent application WO 2011/089179 or U.S. Pat. No. 9,019,666 (incorporated by reference). Specifically, it has been shown in this international patent application WO 2011/089179 that such transistors may also be used to form a trigger circuit.

More precisely, the trigger circuit CD in this case has a first NMOS transistor TN1 with hybrid operation, the gate GN1 and the substrate SBN1 of which are connected together to the source SN1 of the transistor TN1 by a first resistor R1, and a second NMOS transistor TN2 with hybrid operation, the drain DN2 of which is connected to the source SN1 of the first transistor TN1, and the gate GN2 and substrate SBN2 of which are connected together to the source SN2 of the second transistor TN2 by a second resistor R2, the source SN2 of this second transistor TN2 being connected to the cathode K2 of the second thyristor TH2 and therefore to the second terminal B2.

Other conventional structures of trigger circuits (not illustrated), for example MOS transistors whose gate and substrate are connected to earth (here to the terminal B2), which are commonly referred to by a person skilled in the art by the acronym "GGNMOS" ("Grounded-Gate NMOS"), are also possible.

It should be noted that the trigger circuit CD may advantageously be a trigger circuit identical to that implemented in a conventional protective device having a single thyristor.

Thus, with a trigger voltage of the order of 3.6 volts, a holding voltage of the order of 4 volts and a supply voltage of 3.3 volts, triggering in the event of an overstress on the component during operation does not maintain a conductive state of the electronic device DE at the end of the overstress.

Thus, an electronic device for protection against overvoltages is obtained which has a high holding voltage while avoiding a significant increase in the trigger voltage compared with a protective device having a single thyristor. Such an electronic device advantageously requires a reduced surface occupancy on silicon compared with a protective device having three thyristors.

Of course, such a device may also be used to protect the component against electrostatic discharges (ESD) when the component is not in operation, i.e. not supplied.

It would be possible to increase further the number of thyristors of the sequence, their gates being connected together in order to form the single gate. This would make it possible to increase the holding voltage of the overall device further. In this case, the number of elements of the trigger circuit, for example the number of transistors with hybrid operation connected in series, would be increased accordingly in comparison with the embodiment of FIG. 4.

From an integration point of view, all the thyristors would then be produced in the same semiconductor body CS (FIGS. 2 and 3), with the anode of one thyristor of the sequence connected by a metallization to the cathode of the thyristor preceding it in the sequence.

The invention claimed is:

1. An electronic device, comprising:
a sequence of at least two thyristors coupled in series in a same conduction direction, each thyristor having a gate of a first conductivity type, wherein the gates of the first conductivity type for the sequence of at least two thyristors are coupled together in order to form a single gate;
wherein the at least two thyristors are arranged in a same semiconductor body having the first conductivity type, the semiconductor body forming the single gate; and
wherein each thyristor has, within the semiconductor body, a first semiconductor region having a second conductivity type opposite to the first conductivity type and a second semiconductor region having the second conductivity type;
wherein said second semiconductor region includes a semiconductor zone having the first conductivity type,
wherein the first semiconductor region of a first thyristor in said sequence being coupled by a metallization lying above the semiconductor body to the semiconductor zone of a second thyristor preceding the first thyristor in said sequence, and
wherein the first semiconductor region of the first thyristor is separated from the second semiconductor region of the second thyristor by a portion of the semiconductor body.

2. The device according to claim 1, wherein the first conductivity type is an N-type conductivity.

3. The device according to claim 1, wherein the semiconductor body has a zone doped more heavily than a rest of the semiconductor body, said zone surrounding all the semiconductor regions and forming a contact for the single gate.

4. The device according to claim 1, further comprising a trigger circuit coupled to the single gate.

5. The device according to claim 1, wherein an anode of the first thyristor is coupled to a cathode of the second thyristor by said metallization.

6. The device according to claim 5, wherein a trigger circuit is coupled to the single gate and to a cathode of the first thyristor.

7. The device according to claim 1, further comprising a component connected between two ends of the sequence of thyristors, and a trigger circuit coupled between the single gate and to one of the ends.

8. The device according to claim 1, further comprising an additional metallization electrically connecting the semiconductor zone and the second semiconductor region.

9. The device according to claim 8, wherein the semiconductor body has a zone doped more heavily than a rest of the semiconductor body, said zone surrounding the thyristors and forming a contact for the single gate.

10. An integrated circuit, comprising:
a first thyristor and a second thyristor connected in series with each other in a same conduction direction, wherein gates of the first and second thyristors are coupled together in order to form a single gate;
wherein the first and second thyristors are arranged in a semiconductor body having a first conductivity type;
wherein the first thyristor comprises:
a first semiconductor region in the semiconductor body having a second conductivity type opposite to the first conductivity type, the first semiconductor region forming an anode of the first thyristor; and
a second semiconductor region in the semiconductor body having the second conductivity type, the first and second semiconductor regions separated from each other by a portion of the semiconductor body, the second semiconductor region including a region of the first conductivity forming a cathode of the first thyristor; and
wherein the second thyristor comprises:
a third semiconductor region in the semiconductor body having the second conductivity type, the third semiconductor region forming an anode of the second thyristor; and
a fourth semiconductor region in the semiconductor body having the second conductivity type, the third and fourth semiconductor regions separated from each other by the portion of the semiconductor body, the fourth semiconductor region including a region of the first conductivity forming a cathode of the second thyristor; and
wherein the semiconductor body forms said single gate;
wherein a metallization above the semiconductor body directly electrically connects the cathode of the first thyristor to the anode of the second thyristor; and
wherein the second semiconductor region of the first thyristor and the third semiconductor region of the second thyristor are separated from each other by said portion of the semiconductor body.

11. The integrated circuit of claim 10, further comprising a heavily doped region of the first conductivity type formed in said portion of the semiconductor body and configured to provide a contact for said control gate.

12. The integrated circuit of claim 10, wherein said metallization provides an electrical connection configured to connect the cathode of the first thyristor to the anode of the second thyristor.

13. The integrated circuit of claim 10, further comprising:
a first heavily doped region of the first conductivity type formed in said portion of the semiconductor body separating the first and second semiconductor regions and configured to provide a contact for said control gate of the first thyristor; and
a second heavily doped region of the first conductivity type formed in said portion of the semiconductor body separating the third and fourth semiconductor regions and configured to provide a contact for said control gate of the second thyristor.

14. The integrated circuit of claim 13, further comprising:
a third heavily doped region of the first conductivity type formed in said portion of the semiconductor body separating the second semiconductor region of the first thyristor and the third semiconductor region of the second thyristor and configured to provide a contact for said control gate of the first and second thyristors.

15. An electronic device, comprising:
a semiconductor body having a first conductivity type; and
an electronic circuit formed in said semiconductor body, said electronic circuit consisting of a first thyristor and a second thyristor, where each of the first and second thyristors has, within the semiconductor body:
a first semiconductor region having a second conductivity type opposite to the first conductivity type;
a second semiconductor region having the second conductivity type; and
a semiconductor zone having the first conductivity type within the second semiconductor region; and
a region of the first conductivity type in the semiconductor body forming a single gate for both the first and second thyristors; and a metallization lying above the semiconductor body that electrically connects the first semiconductor region of the first thyristor to the semiconductor zone of the second thyristor so as to couple the first and second thyristors in series in a same conduction direction.

16. The device according to claim 15, wherein the first conductivity type is an N-type conductivity.

17. The device according to claim 15, wherein the region of the first conductivity type in the semiconductor body surrounds each of the first and second semiconductor regions.

18. The device according to claim 15, further comprising a trigger circuit coupled to the single gate.

* * * * *